(12) United States Patent
Lan et al.

(10) Patent No.: US 11,004,906 B2
(45) Date of Patent: May 11, 2021

(54) DISPLAY PANEL, DISPLAY APPARATUS, AND MASK PLATE FOR FABRICATING DISPLAY PANEL

(71) Applicants: BOE TECHNOLOGY GROUP CO., LTD., Beijing (CN); Chengdu BOE Optoelectronics Technology Co., Ltd., Sichuan (CN)

(72) Inventors: Lan Lan, Beijing (CN); Jianpeng Wu, Beijing (CN); Zhongying Yang, Beijing (CN); Yi Qu, Beijing (CN)

(73) Assignees: BOE TECHNOLOGY GROUP CO., LTD., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 623 days.

(21) Appl. No.: 15/761,368

(22) PCT Filed: Sep. 18, 2017

(86) PCT No.: PCT/CN2017/102050
§ 371 (c)(1),
(2) Date: Mar. 19, 2018

(87) PCT Pub. No.: WO2018/099159
PCT Pub. Date: Jun. 7, 2018

(65) Prior Publication Data
US 2020/0251534 A1    Aug. 6, 2020

(30) Foreign Application Priority Data
Dec. 2, 2016 (CN) .......................... 201611094941.1

(51) Int. Cl.
*H01L 27/32* (2006.01)
(52) U.S. Cl.
CPC ............................ *H01L 27/3218* (2013.01)

(58) Field of Classification Search
None
See application file for complete search history.

(56) References Cited

U.S. PATENT DOCUMENTS

2004/0135498 A1     7/2004  Takanosu et al.
2009/0289963 A1*   11/2009  Minami .............. H01L 27/3262
                                                          345/690
(Continued)

FOREIGN PATENT DOCUMENTS

JP       H03233593 A    10/1991
KR       101058092 B1    8/2011

OTHER PUBLICATIONS

The Extended European Search Report in the European Patent Application No. 17857673.2, dated Oct. 14, 2020.
(Continued)

*Primary Examiner* — Bilkis Jahan
(74) *Attorney, Agent, or Firm* — Intellectual Valley Law, P.C.

(57) ABSTRACT

The present application discloses a display panel having a display area tessellated by repetition of a first subpixel group. The display panel includes an array of a plurality of first subpixel groups. Each of the plurality of first, subpixel groups includes a first subgroup and a second subgroup sequentially along a first direction. The first subgroup includes, a first subpixel of a first color, a first subpixel of a second color, and a first subpixel of a third color, sequentially along a second direction, the second direction being different from tire first direction. The second subgroup includes a second subpixel of the third color, a second subpixel of the second color, a second subpixel of the first color, a third subpixel of the third color, a third subpixel of the second color, and a third subpixel of the first color, sequentially along the second direction.

19 Claims, 10 Drawing Sheets

(56) References Cited

U.S. PATENT DOCUMENTS

| | | | |
|---|---|---|---|
| 2010/0118045 A1 | 5/2010 | Brown Elliott et al. | |
| 2016/0155777 A1* | 6/2016 | Kabe | G09G 3/32 257/89 |
| 2016/0240593 A1 | 8/2016 | Gu et al. | |
| 2017/0330497 A1* | 11/2017 | Phan | G02F 1/133514 |

OTHER PUBLICATIONS

The Partial Supplementary European Search Report in the European Patent Application No. 17857673.2, dated May 25, 2020.
First Office Action in the Indian Patent Application No. 201847018137, dated Jun. 15, 2020.

* cited by examiner

DISPLAY PANEL, DISPLAY APPARATUS, AND MASK PLATE FOR FABRICATING DISPLAY PANEL

CROSS-REFERENCE TO RELATED APPLICATION

This application is a national stage application under 35 U.S.C. § 371 of International Application No. PCT/CN2017/102050, filed Sep. 18, 2017, which claims priority to Chinese Patent Application No. 201611094941.1, filed Dec. 2, 2016, the contents of which are incorporated by reference in the entirety.

TECHNICAL FIELD

The present invention relates to display technology, more particularly, to a display panel, a display apparatus, and a mask plate for fabricating the display panel.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present disclosure provides a display panel having a display area tessellated by repetition of a first subpixel group, comprising an array of a plurality of first subpixel groups; wherein each of the plurality of first subpixel groups comprises a first subgroup and a second subgroup sequentially along a first direction; the first subgroup comprising a first subpixel of a first color, a first subpixel of a second color, and a first subpixel of a third color, sequentially along a second direction, the second direction being different from the first direction; the second subgroup comprising a second subpixel of the third color, a second subpixel of the second color, a second subpixel of the first color, a third subpixel of the third color, a third subpixel of the second color, and a third subpixel of the first color, sequentially along the second direction; the first subpixel of the first color in the first subgroup is adjacent to the second subpixel of the third color and the second subpixel of the second color in the second subgroup the first subpixel of the second color in the first subgroup is adjacent to the second subpixel of the first color and the third subpixel of the third color in the second subgroup; and the first subpixel of the third color in the first subgroup is adjacent to the third subpixel of the second color and the third subpixel of the first color in the second subgroup.

Optionally, the plurality of first subpixel groups in each row along the second direction are repeated; and the plurality of first subpixel groups in each row are staggered relative to the plurality of first subpixel groups in an adjacent row.

Optionally, the display area is tessellated by repetition of a subpixel repeating unit, the display panel comprises an array of a plurality of subpixel repeating units; the plurality of subpixel repeating units comprises the plurality of first subpixel groups and a plurality of second subpixel groups; each of the plurality of subpixel repeating units comprises one of the plurality of first subpixel groups and one of the plurality of second subpixel groups sequentially along the first direction; wherein each of the plurality of second subpixel groups comprises a third subgroup and a fourth subgroup sequentially along a first direction; the third subgroup comprising a fourth subpixel of the second color, a fourth subpixel of the third color, and a fourth subpixel of the first color, substantially along the second direction; the fourth subgroup comprising a fifth subpixel of the first color, a fifth subpixel of the third color, a fifth subpixel of the second color, a sixth subpixel of the first color, a sixth subpixel of the third color, and a sixth subpixel of the second color, substantially along the second direction; the fourth subpixel of the second color in the third subgroup is adjacent to the fifth subpixel of the first color and the fifth subpixel of the third color in the fourth subgroup; the fourth subpixel of the third color in the third subgroup is adjacent to the fifth subpixel of the second color and the sixth subpixel of the first color in the fourth subgroup; and the first subpixel of the first color in the third subgroup is adjacent to the sixth subpixel of the third color and the sixth subpixel of the second color in the fourth subgroup.

Optionally, the plurality of subpixel repeating units in each row along the second direction are repeated; and the plurality of subpixel repeating units in each column along the first direction are repeated.

Optionally, the first subpixel of the first color in the first subgroup is adjacent to the fifth subpixel of the third color and the fifth subpixel of the second color in the fourth subgroup; the first subpixel of the second color in the first subgroup is adjacent to the sixth subpixel of the first color and the sixth subpixel of the third color in the fourth subgroup; and the first subpixel of the third color in the first subgroup is adjacent to the sixth subpixel of the second color and the fifth subpixel of the first color in the fourth subgroup.

Optionally, the fourth subpixel of the second color in the third subgroup is adjacent to the third subpixel of the first color in the second subgroup in one of the plurality of first subpixel groups in a first adjacent subpixel repeating unit, and the second subpixel of the third color in one of the plurality of first subpixel groups in a second adjacent subpixel repeating unit; the fourth subpixel of the third color in the third subgroup is adjacent to the second subpixel of the second color and the second subpixel of the first color in the second subgroup in one of the plurality of first subpixel groups in the next adjacent subpixel repeating unit; and the fourth subpixel of the first color in the third subgroup is adjacent to the third subpixel of the third color and the third subpixel of the second color in the second subgroup in one of the plurality of first subpixel groups in the next adjacent subpixel repeating unit.

Optionally, the plurality of first subpixel groups are repeated in a first row substantially along the second direction, the plurality of second subpixel groups are repeated in a second row substantially along the second direction, the second row adjacent to the first row; each of the plurality of first subpixel groups and each of the plurality of second subpixel groups comprises three pixels, each of which comprises three subpixels of different colors; the three subpixels of different colors in each of the three pixels are arranged in a first sub-row and a second sub-row; each of the three subpixels of different colors comprises two subpixels in the first sub-row and one subpixel in the second sub-row; subpixels in the second sub-row of the three pixels are subpixels of different colors; the one of the plurality of first subpixel groups and the one of the plurality of second subpixel groups in each of the plurality subpixel repeating units are staggered relative to each other, the second sub-row in the one of the plurality of first subpixel groups is adjacent to the first sub-row of the one of the plurality of second subpixel groups; each subpixel in the second sub-row in the one of the plurality of first subpixel groups and two adjacent subpixels in the first sub-row in the one of the plurality of second subpixel groups are subpixels of three different colors.

Optionally, light from the three subpixels of different colors in each of the three pixels is configured to produce white light when mixed in a certain ratio.

Optionally, each subpixel in each of the plurality of first subpixel groups and each of the plurality of second subpixel groups has a rectangular shape.

Optionally, a longitudinal direction of each subpixel in each first sub-row of the plurality of first subpixel groups and the plurality of second subpixel groups is substantially parallel to the first direction; and a longitudinal direction of each subpixel each second sub-row of the plurality of first subpixel groups and the plurality of second subpixel groups is substantially parallel to the second direction.

Optionally, in each of the three pixels of each of the plurality of first subpixel groups and each of the plurality of second subpixel groups, a longitudinal side of the one subpixel in the second sub-row is adjacent to lateral sides of the two subpixels in the first sub-row.

Optionally, each of the three pixels of each of the plurality of first subpixel groups and each of the plurality of second subpixel groups has a pixel width; and the one of the plurality of first subpixel groups and the one of the plurality of second subpixel groups in each of the plurality of subpixel repeating units are staggered relative to each other by a distance in a range of approximately 0.4 of the pixel width to approximately 0.6 of the pixel width.

Optionally, two adjacent subpixels respectively in two adjacent pixels in the first sub-row are spaced apart by a first distance; two adjacent subpixels respectively in two adjacent pixels in the second sub-row are spaced apart by a second distance; and the first distance is substantially the same as the second distance.

Optionally, the one of the plurality of first subpixel groups in each of the plurality of subpixel repeating units comprises a first pixel, a second pixel, and a third pixel along the second direction; the one of the plurality of second subpixel groups in each of the plurality of subpixel repeating units comprises a fourth pixel, a fifth pixel, and a sixth pixel along the second direction; each of the first pixel, the second pixel, the third pixel, the fourth pixel, the fifth pixel, and the sixth pixel comprises a subpixel of the first color, a subpixel of the second color, and a subpixel of the third color; the first pixel comprising the subpixel of the third color and the subpixel the second color sequentially along the second direction in the first sub-row, and the subpixel of the first color in the second sub-row; the second pixel comprising the subpixel of the first color and the subpixel of the third color sequentially along the second direction in the first sub-row, and the subpixel of the second color in the second sub-row; the third pixel comprising the subpixel of the second color and the subpixel of the first color sequentially along the second direction in the first sub-row, and the subpixel of the third color in the second sub-row; the fourth pixel comprising the subpixel of the first color and the subpixel of the third color sequentially along the second direction in the first sub-row, and the subpixel of the second color in the second sub-row; the fifth pixel comprising the subpixel of the second color and the subpixel of the first color sequentially along the second direction in the first sub-row, and the subpixel of the third color in the second sub-row; the sixth pixel comprising the subpixel of the third color and the subpixel of the second color sequentially along the second direction the first sub-row, and the subpixel of the first color in the second sub-row.

Optionally, the first color, the second color, and the third color are three different colors selected from blue, green, and red.

Optionally, the first color, the second color, and the third color are three different colors selected from yellow, magenta, and cyan.

In another aspect, the present disclosure provides a display apparatus comprising the display panel described herein.

Optionally, each of the first subpixel the first color, the first subpixel of the second color, the first subpixel of the third color, the second subpixel of the first color, the second subpixel of the second color, the second subpixel of the third color, the third subpixel of the first color, the third subpixel of the second color, and the third subpixel of the third color is electrically connected to a different driving thin film transistor.

Optionally, the display apparatus is an organic light emitting, diode display apparatus.

In another aspect, the present disclosure provides a mask plate for fabricating the display panel described herein: wherein the mask plate has a plurality of light transmissive regions, each of which corresponding to a subpixel of a same color.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
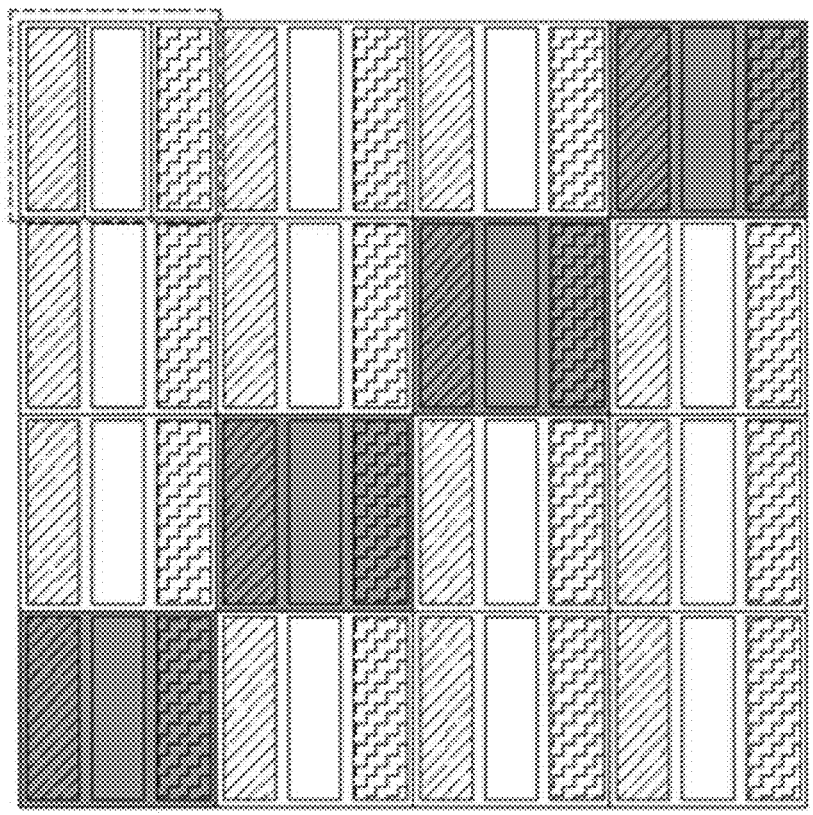
FIG. 1 is a schematic diagram illustrating the structure of a conventional real-RGB type subpixel arrangement structure.
Figure 2:
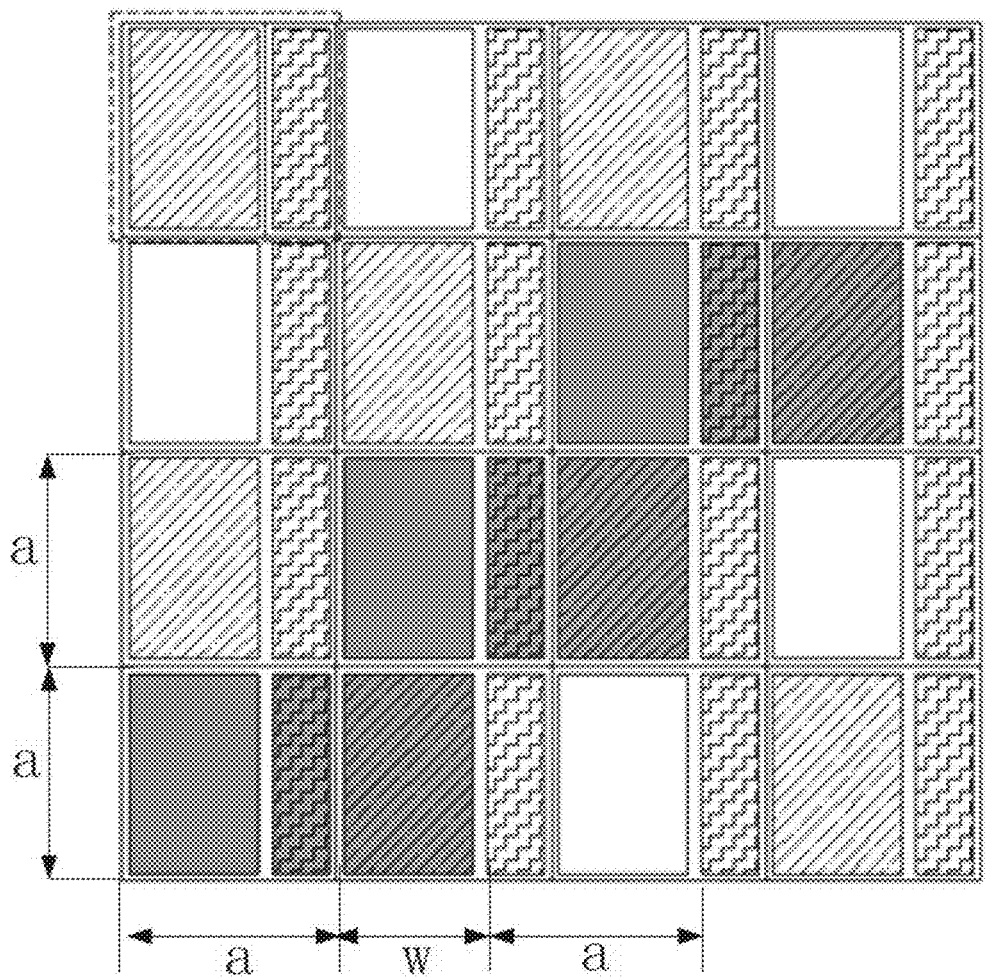
FIG. 2 is a schematic diagram illustrating the structure of a conventional Pentile type subpixel arrangement structure.

Conventional subpixel arrangement structures in the organic light emitting diode display apparatus includes a real-RGB type subpixel arrangement structure and a Pentile type subpixel arrangement structure. FIG. 1 is a schematic diagram illustrating the structure of a conventional real-RGB type subpixel arrangement structure. In the real-RGB type subpixel arrangement structure, each pixel includes a red subpixel, a green subpixel, and a blue subpixel. For high-resolution display apparatuses, a unit area of the pixel becomes much smaller, it is very expensive and complicated to make the fine metal mask plate for patterning the subpixels. The Pentile type subpixel arrangement structure was developed to meet the demand of the high-resolution display apparatuses. FIG. 2 is a schematic diagram illustrating the structure of a conventional Pentile type subpixel arrangement structure. Referring to FIG. 2, each pixel include two subpixels of different colors, and the subpixel of a third color comes from a neighboring pixel.

However, when displaying a 45-degree diagonal white line, a low-resolution Pentile type display apparatus has issues of granularity and jagged edges in the displayed image. As shown in FIG. 1 and FIG. 2, a minimum constituent pixel unit along the diagonal white line in the conventional Pentile type subpixel arrangement structure has an area that is wider than a minimum constituent pixel unit in the RGB type subpixel arrangement structure by a subpixel width. Thus, the conventional Pentile type subpixel arrangement structure is not suitable for low-resolution display apparatuses.

Accordingly, the present disclosure provides, inter alia, a display panel, a display apparatus having the same, and a mask plate for fabricating a display panel that substantially obviate one or more of the problems due to limitations and disadvantages of the related art. In one aspect, the present disclosure provides a display panel having a display area tessellated by repetition of a first subpixel group. In some embodiments, the display panel includes (e.g., comprises, essentially consists of, consist of) an array of a plurality of first subpixel groups. Each of plurality of first subpixel groups includes (e.g., comprises, essentially consists of, consists of) a first subgroup and a second subgroup sequentially arranged along a first direction. The first subgroup includes a first subpixel of a first color, a first subpixel of a second color, and a first subpixel of a third color, sequentially arranged along a second direction, the second direction being different from the first direction. The second subgroup includes a second subpixel of the third color, a second subpixel of the second color, a second subpixel of the first color, a third subpixel of the third color, a third subpixel of the second color, and a third subpixel of the first color, sequentially arranged along the second direction. The first subpixel of the first color in the first subgroup is adjacent to the second subpixel of the third color and the second subpixel of the second color in the second subgroup. The first subpixel of the second color in the first subgroup is adjacent to the second subpixel of the first color and the third subpixel of the third color in the second subgroup. The first subpixel of the third color in the first subgroup is adjacent to the third subpixel of the second color and the third subpixel of the first color in the second subgroup.

Optionally, none of the subpixels in the present display panel is adjacent to a subpixel of a same color, i.e., any subpixel adjacent to a subpixel of interest in the present display panel is a subpixel of a color different from that of the subpixel of interest.

Optionally, the present display panel includes two types of subpixels. The subpixel of a first type is adjacent to six neighboring subpixels. The subpixel of a second type is adjacent to four neighboring subpixels.

Figure 3:
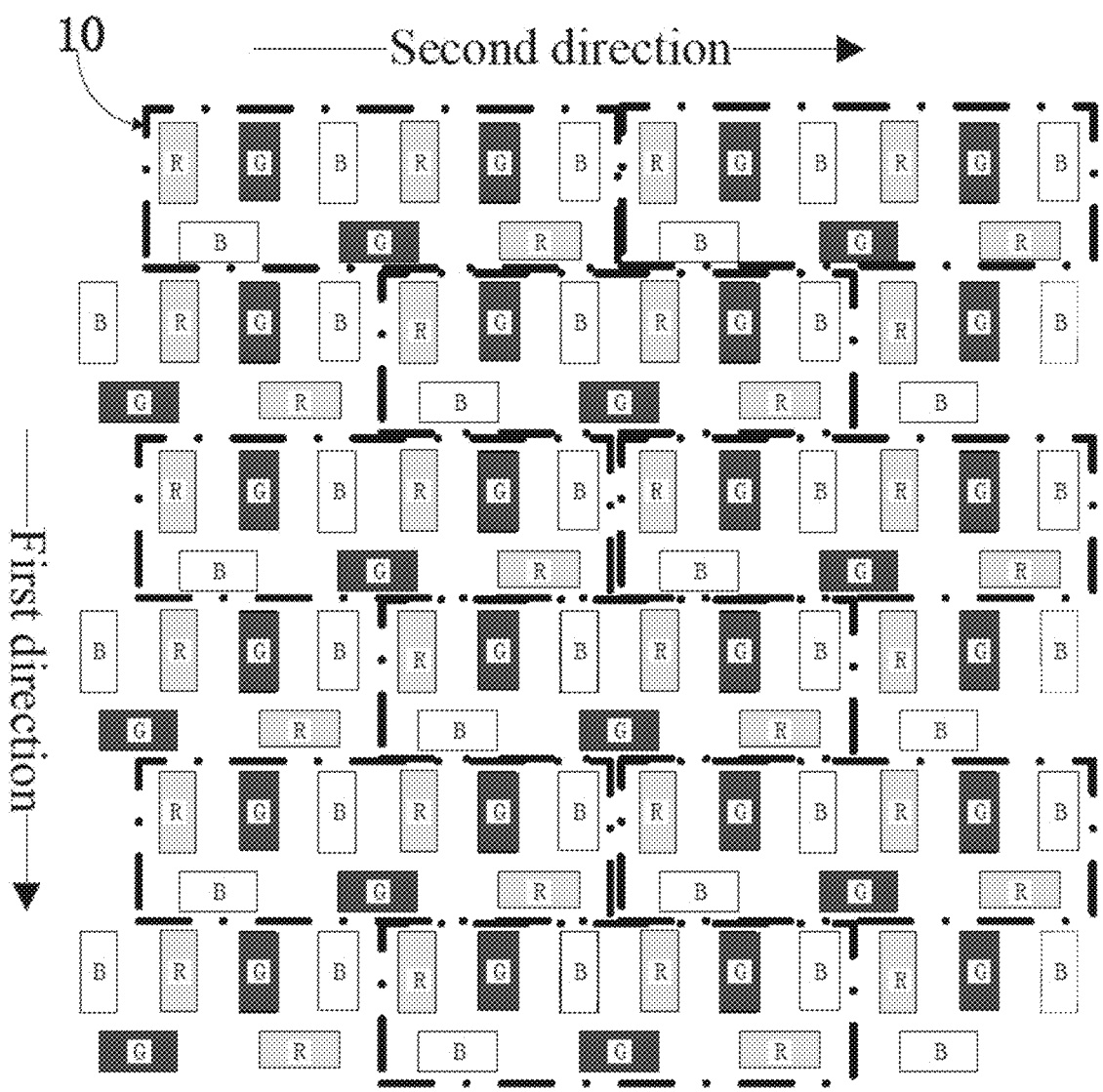
FIG. 3 is a schematic diagram illustrating the structure of a subpixel arrangement structure in a display panel in some embodiments according to the present disclosure.
Figure 4:
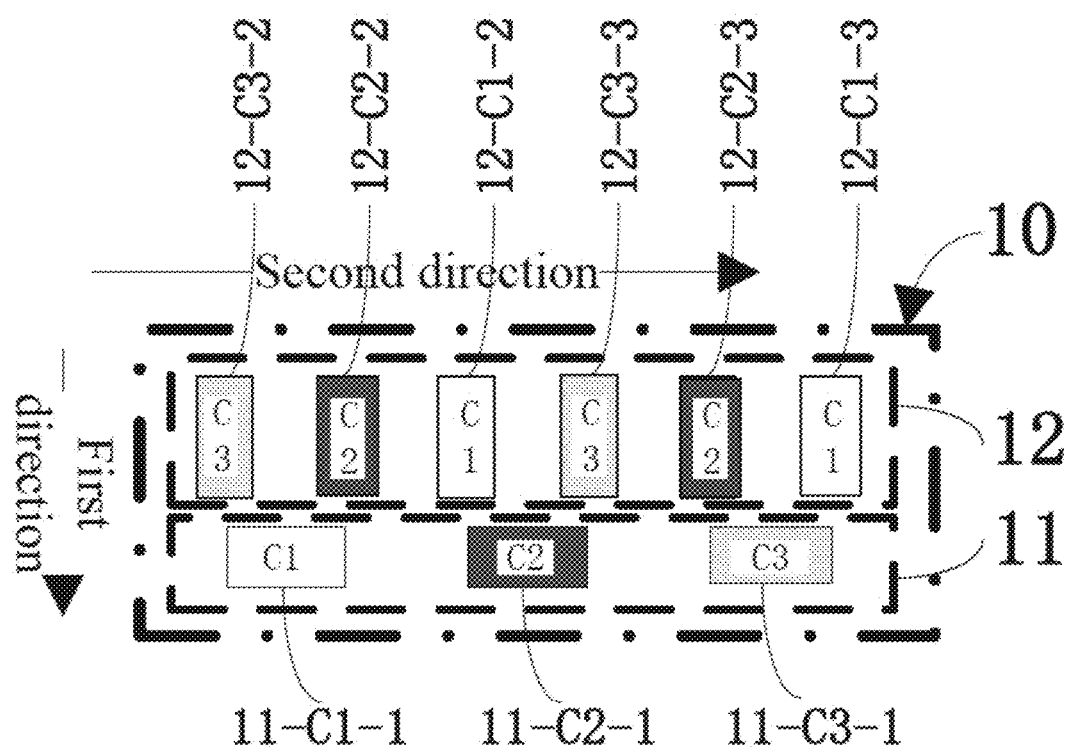
FIG. 4 is a schematic diagram illustrating the structure a first subpixel group in a subpixel arrangement structure in a display panel in some embodiments according to the present disclosure.

FIG. 3 is a schematic diagram illustrating the structure of a subpixel arrangement structure in a display panel in some embodiments according to the present disclosure. FIG. 4 is a schematic diagram illustrating the structure a first subpixel group in a subpixel arrangement structure in a display panel in some embodiments according to the present disclosure. Referring to FIG. 3, the subpixel arrangement structure in the display panel in some embodiments includes (e.g., comprises, essentially consists of, consists of) an array of a plurality of first subpixel groups 10. One of the plurality of first subpixel groups 10 constitutes the minimum repeating unit of the subpixel arrangement structure. As shown in FIG. 3, the plurality of first subpixel groups 10 are repeated along the second direction, and the plurality of first subpixel groups 10 in each row along the second direction are staggered relative to the plurality of first subpixel groups 10 in an adjacent row, e.g., by approximately half the width of one of the plurality of first subpixel groups 10 along the second direction. The plurality of first subpixel groups 10 are repeated along each of the two diagonal directions (diagonal to the first direction and the second direction).

Referring to FIG. 4, each of plurality of first subpixel groups 10 includes a first subgroup 11 and a second subgroup 12. The first subgroup 11 and the second subgroup 12 are sequentially arranged along the first direction. The first subgroup 11 includes a first subpixel of a first color 11-C1-1, a first subpixel of a second color 11-C2-1, and a first subpixel of a third color 11-C3-1. The first subpixel of a first color 11-C1-1, the first subpixel of a second color 11-C2-1, and the first subpixel of a third color 11-C3-1 are sequentially arranged along the second direction. The second subgroup 12 includes a second subpixel of the third color 12-C3-2, a second subpixel of the second color 12-C2-2, second subpixel of the first color 12-C1-2, a third subpixel of the third color 12-C3-3, as third subpixel of the second color 12-C2-3, and a third subpixel of the first color 12-C1-3. The second subpixel of the third color 12-C3-2, the second subpixel of the second color 12-C2-2, the second subpixel of the first color 12-C1-2, the third subpixel of the third color 12-C3-3, the third subpixel of the second color 12-C2-3, and the third subpixel of the first color 12-C1-3 are sequentially arranged along the second direction. The first subpixel of the first color 11-C1-1 in the first subgroup 11 is adjacent to the second subpixel of the third color 12-C3-2 and the second subpixel of the second color 12-C2-2 in the second subgroup 12. The first subpixel of the second color 11-C2-1 in the first subgroup 11 is adjacent to the second subpixel of the first color 12-C1-2 and the third subpixel of the third color 12-C3-3 in the second subgroup 12. The first subpixel of the third color 11-C3-1 in the first subgroup 11 is adjacent to the third subpixel of the second color 12-C2-3 and the third subpixel of the first color 12-C1-3 in the second subgroup 12. In FIG. 3, the first color is blue (denoted as "B"), the second color is green (denoted as "G"), and the third color is red (denoted as "R"). Optionally, the first subgroup 11 and the second subgroup 12 have a substantially the same width along the second direction.

Optionally, a longitudinal direction of each subpixels in the first subgroup 11 is substantially perpendicular to a longitudinal direction of each subpixels in the second subgroup 12. Optionally, a lateral direction of each subpixels in the first subgroup 11 is substantially perpendicular to a lateral direction of each subpixels in the second subgroup 12. Optionally, a longitudinal direction of each subpixels in the first subgroup 11 is substantially parallel to a lateral direction of each subpixels in the second subgroup 12. Optionally, a lateral direction of each subpixels in the first subgroup 11 is substantially parallel to a longitudinal direction of each subpixels in the second subgroup 12.

Optionally, a longitudinal direction of each subpixels in the first subgroup 11 is substantially parallel to a longitudinal direction of each subpixels in the second subgroup 12. Optionally, a lateral direction of each subpixels in the first subgroup 11 is substantially parallel to a lateral direction of each subpixels in the second subgroup 12. Optionally, a longitudinal direction of each subpixels in the first subgroup 11 is substantially perpendicular to a lateral direction of each subpixels in the second subgroup 12. Optionally, a lateral direction of each subpixels in the first subgroup 11 is substantially perpendicular to a longitudinal direction of each subpixels in the second subgroup 12.

Figure 5:
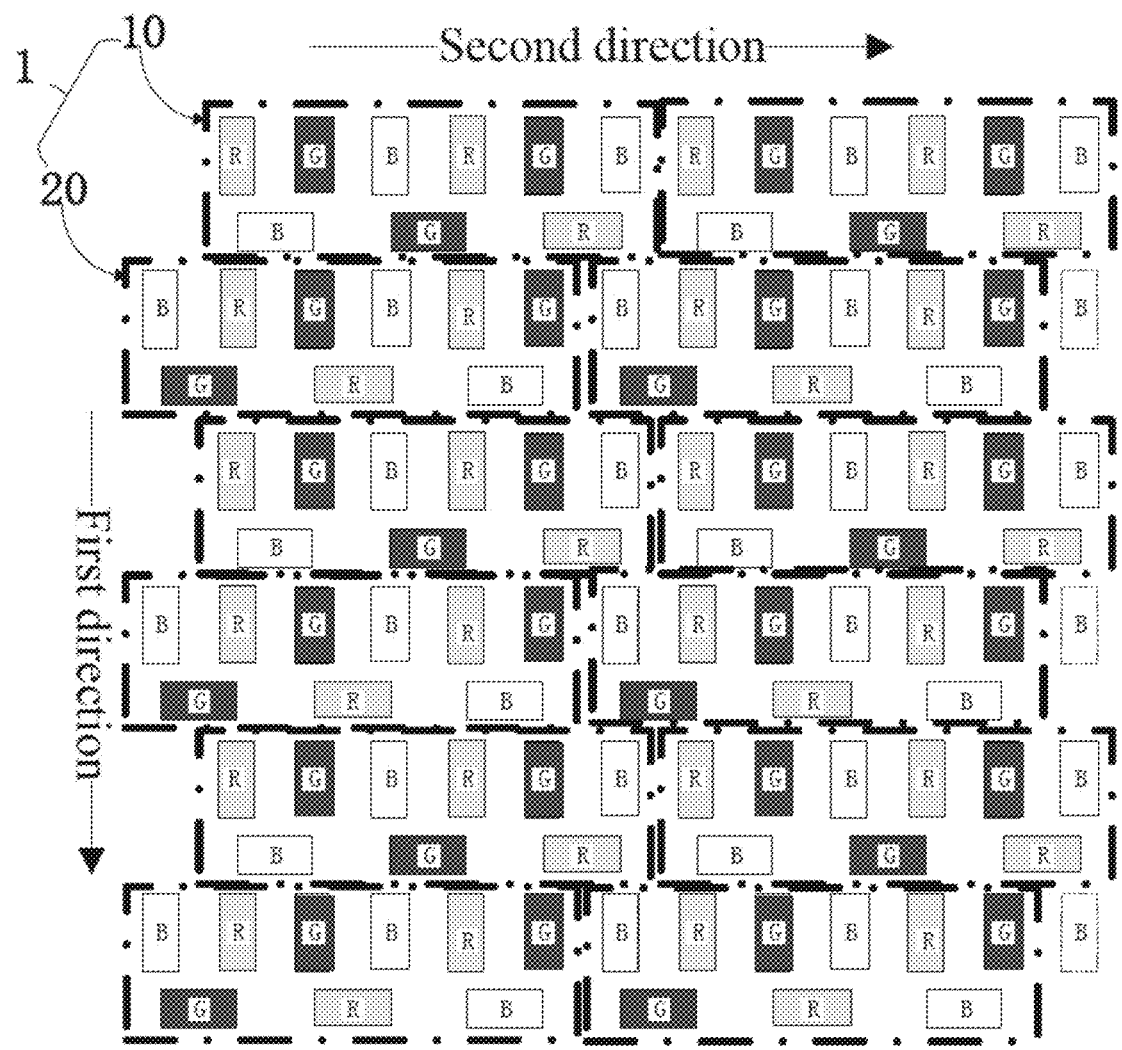
FIG. 5 is a schematic diagram illustrating the structure of a subpixel arrangement structure in a display panel in some embodiments according to the present disclosure.
Figure 6:
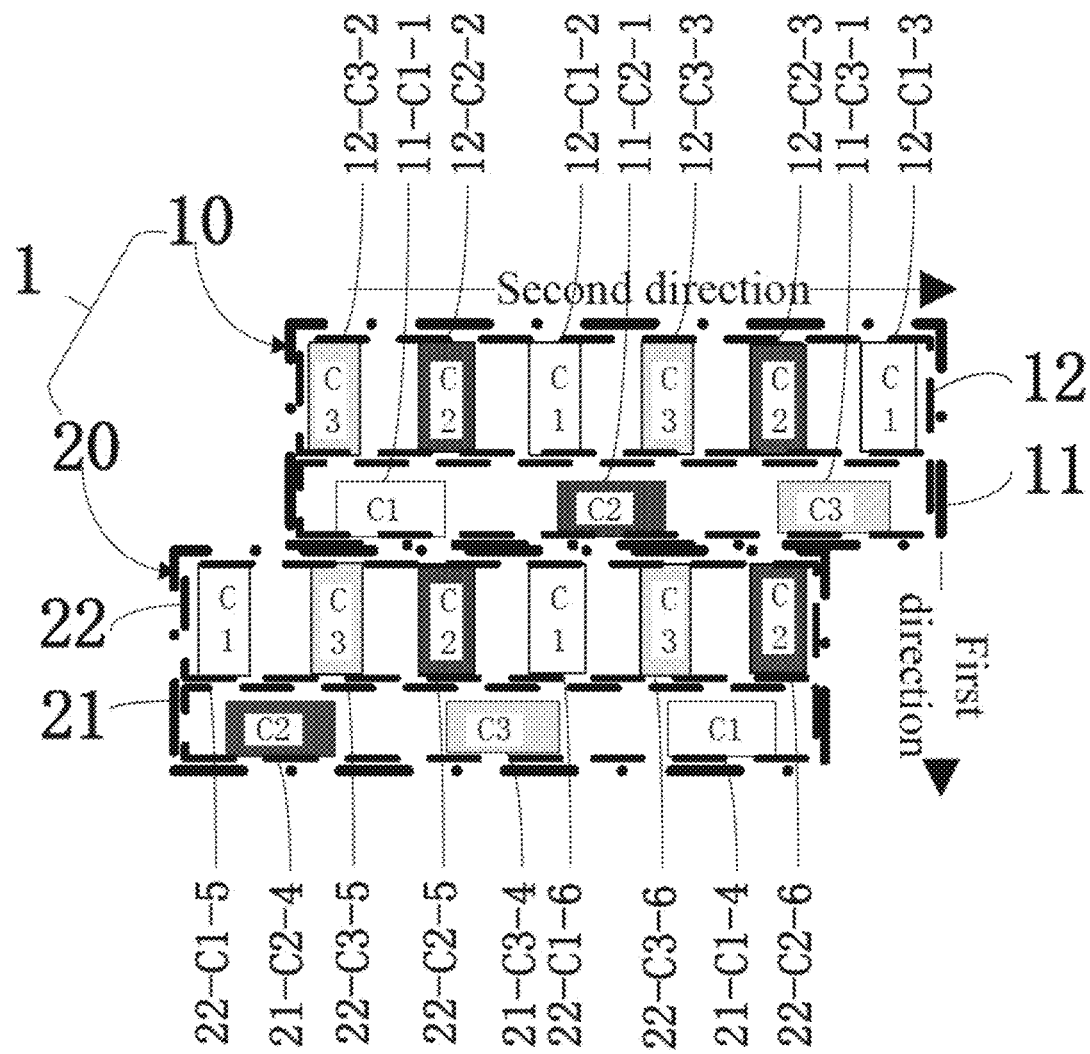
FIG. 6 is a schematic diagram illustrating the structure a subpixel repeating unit in a subpixel arrangement structure in a display panel in some embodiments according to the present disclosure.

The subpixel arrangement structure in some embodiments may be grouped into plurality of subpixel repeating units, e.g., the display, area is tessellated by repetition of a subpixel repeating unit, and the display panel includes (e.g., comprises, essentially consists of, consists of) an array of a plurality of subpixel repeating units. FIG. 5 is a schematic diagram illustrating the structure of a subpixel arrangement structure in a display panel in some embodiments according to the present disclosure. FIG. 6 is a schematic diagram illustrating the structure a subpixel repeating unit in a subpixel arrangement structure in a display panel in some embodiments according to the present disclosure. Referring to FIG. 5, the subpixel arrangement structure in the display panel in some embodiments are grouped into a plurality of subpixel repeating units 1. The plurality of subpixel repeating units 1 are not the minimum repeating unit of the subpixel arrangement structure. However, the plurality of subpixel repeating units 1 are repeated in each row along the second direction and in each column along the first direction, thereby constituting an array of a plurality of subpixel repeating units 1 along the first direction and the second direction. The plurality of subpixel repeating units 1 include a plurality of first subpixel groups 10 and a plurality of second subpixel groups 20. Each of the plurality of subpixel repeating units 1 includes one of the plurality of first subpixel groups 10 and one of the plurality of second subpixel groups 20. The one of the plurality of first subpixel groups 10 and the one of the plurality of second subpixel groups 20 in each of the plurality of subpixel repeating units 1 are sequentially arranged along the first direction. Optionally, the one of the plurality of first subpixel groups 10 and the one of the plurality of second subpixel groups 20 in each of the plurality of subpixel repeating units 1 have a substantially the same width along the second direction. Optionally, the one of the plurality of first subpixel groups 10 and the one of the plurality of second subpixel groups 20 in each of the plurality, of subpixel repeating units 1 have a substantially the same width along the first direction.

Referring to FIG. 6, each of plurality of first subpixel groups 10 includes a first subgroup 11 and a second subgroup 12. The first subgroup 11 and the second subgroup 12 are sequentially arranged along the first direction. The first subgroup 11 includes a first subpixel of a first color 11-C1-1, a first subpixel of a second color 11-C2-1, and a first subpixel of a third color 11-C3-1. The first subpixel of a first color 11-C1-1, the first subpixel of a second color 11-C2-1, and the first subpixel of a third color 11-C3-1 are sequentially arranged along the second direction. The second subgroup 12 includes a second subpixel of the third color 12-C3-2, a second subpixel of the second color 12-C2-2, a second subpixel of the first color 12-C1-2, a third subpixel of the third color 12-C3-3, a third subpixel of the second color 12-C2-3, and a third subpixel of the first color 12-C1-3. The second subpixel of the third color 12-C3-2, the second subpixel of the second color 12-C2-2, the second subpixel of the first color 12-C1-2, the third subpixel of the third color 12-C3-3, the third subpixel of the second color 12-C2-3, and the third subpixel the first color 12-C1-3 are sequentially arranged along the second direction. The first subpixel of the first color 11-C1-1 in the first subgroup 11 is adjacent to the second subpixel of the third color 12-C3-2 and the second subpixel of the second color 12-C2-2 in the second subgroup 12. The first subpixel of the second color 11-C2-1 in the first subgroup 11 is adjacent to the second subpixel of the first color 12-C1-2 and the third subpixel of the third color 12-C3-3 in the second subgroup 12. The first subpixel of the third color 11-C3-1 in the first subgroup 11 is adjacent to the third subpixel of the second color 12-C2-3 and the third subpixel of the first color 12-C1-3 in the second subgroup 12. In FIG. 5, the first color is blue (denoted as "B"), the second color is green (denoted as "G"), and the third color is red (denoted as "R").

Each of plurality of second subpixel groups 20 includes a third subgroup 21 and a fourth subgroup 22. The third subgroup 21 and the fourth subgroup 22 are sequentially arranged along the first direction. The third subgroup 21 includes a fourth subpixel of the second color 21-C2-4, a fourth subpixel of the third color 21-C3-4, and a fourth subpixel of the first color 21-C1-4. The fourth subpixel of the second color 21-C2-4, the fourth subpixel of the third color 21-C3-4, and the fourth subpixel the first color 21-C1-4 are sequentially arranged along the second direction. The fourth subgroup 22 includes a fifth subpixel of the first color 22-C1-5, fifth subpixel of the third color 22-C3-5, a fifth subpixel of the second color 22-C2-5, a sixth subpixel of the first color 22-C1-6, a sixth subpixel of the third color 22-C3-6, and a sixth subpixel of the second color 22-C2-6. The fifth subpixel of the first color 22-C1-5, the fifth subpixel of the third color 22-C3-5, the fifth subpixel of the second color 22-C2-5, the sixth subpixel of the first color 22-C1-6, the sixth subpixel of the third color 22-C3-6, and the sixth subpixel of the second color 22-C2-6 are sequentially arranged along the second direction. The fourth subpixel of the second color 21-C2-4 in the third subgroup 21 is adjacent to the fifth subpixel of the first color 22-C1-5 and the fifth subpixel of the third color 22-C3-5 in the fourth subgroup 22. The fourth subpixel of the third color 21-C3-4 in the third subgroup 21 is adjacent to the fifth subpixel of the second color 22-C2-5 and the sixth subpixel of the first color 22-C1-6 in the fourth subgroup 22. The fourth subpixel of the first color 21-C1-4 in the third subgroup 21 is adjacent to the sixth subpixel of the third color 22-C3-6 and the sixth subpixel of the second color 22-C2-6 in the fourth subgroup 22. In FIG. 5, the first color is blue (denoted as "B"), the second color is green (denoted as "G"), and the third color is red (denoted as "R").

Referring to FIG. 6, the first subpixel of the first color 11-C1-1 in the first subgroup 11 is adjacent to the fifth subpixel of the third color 22-C3-5 and the fifth subpixel of the second color 22-C2-5 in the fourth subgroup 22; the first subpixel of the second color 11-C2-1 in the first subgroup 11 is adjacent to the sixth subpixel of the first color 22-C1-6 and the sixth subpixel of the third color 22-C3-6 in the fourth subgroup 22; and the first subpixel the third color 11-C3-1 in the first subgroup 11 is adjacent to the sixth subpixel of the second color 22-C2-6 and the fifth subpixel of the first color 22-C1-5 in the fourth subgroup 22.

Referring to FIG. 5 and FIG. 6, the fourth subpixel of the second color 21-C2-4 in the third subgroup 21 is adjacent to the third subpixel of the first color 12-C1-3 in the second subgroup 12 in one of the plurality of first subpixel groups 10 in a first adjacent subpixel repeating unit, and the second subpixel of the third color 12-C3-2 in one of the plurality of first subpixel groups 10 in a second adjacent subpixel repeating unit. The fourth subpixel of the third color 21-C3-4 in the third subgroup 21 is adjacent to the second subpixel of the second color 12-C2-2 and the second subpixel of the first color 12-C1-2 in the second subgroup 12 in one of the plurality of first subpixel groups 10 in the next adjacent subpixel repeating unit. The fourth subpixel of the first color 21-C1-4 in the third subgroup 21 is adjacent to the third subpixel of the third color 12-C3-3 and the third subpixel of the second color 12-C2-3 in the second subgroup 12 in one of the plurality of first subpixel groups 10 in the next adjacent subpixel repeating unit.

Referring to FIG. 5, the plurality of subpixel repeating units 1 in each row along the second direction are repeated; and the plurality of subpixel repeating units 1 in each column along the first direction are repeated.

The present subpixel arrangement structure has characteristics and advantages of both the real-RGB type and the Pentile type subpixel arrangements. Accordingly, the present subpixel arrangement structure effectively enhances the resolution of a display apparatus having the present subpixel arrangement structure. Moreover, the present subpixel arrangement structure is compatible with both high-resolution display apparatuses as well as low-resolution display apparatuses.

Figure 7:
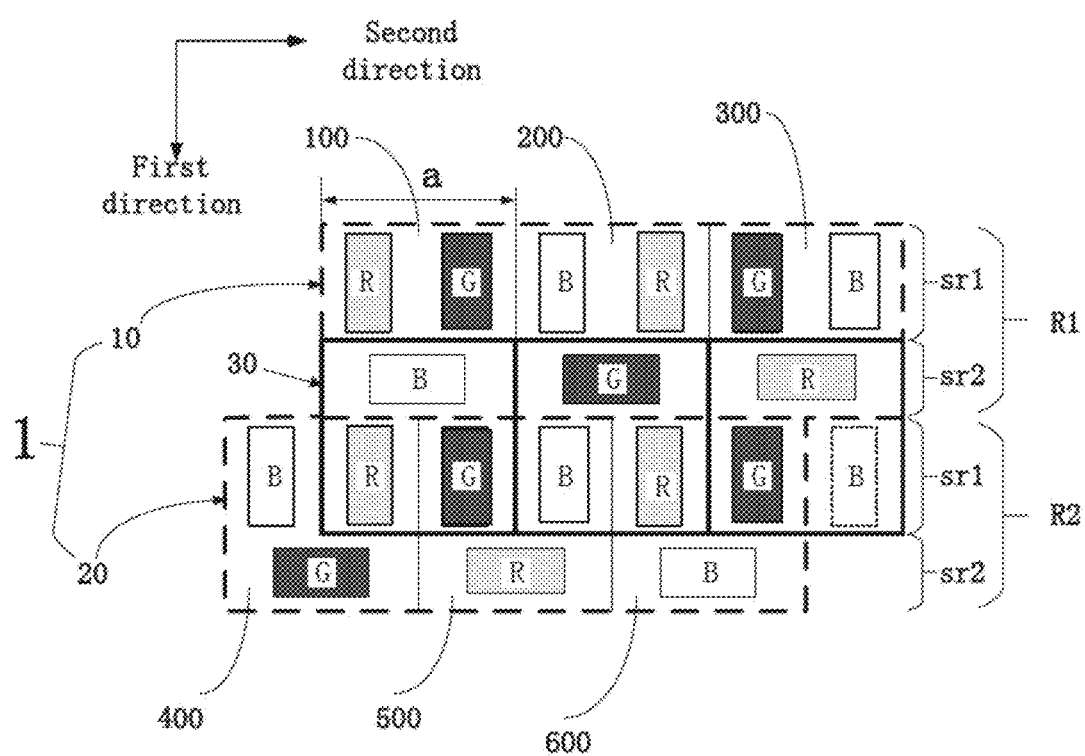
FIG. 7 is a schematic diagram illustrating the structure a subpixel repeating unit in a subpixel arrangement structure in a display panel in some embodiments according to the present disclosure.
Figure 8:
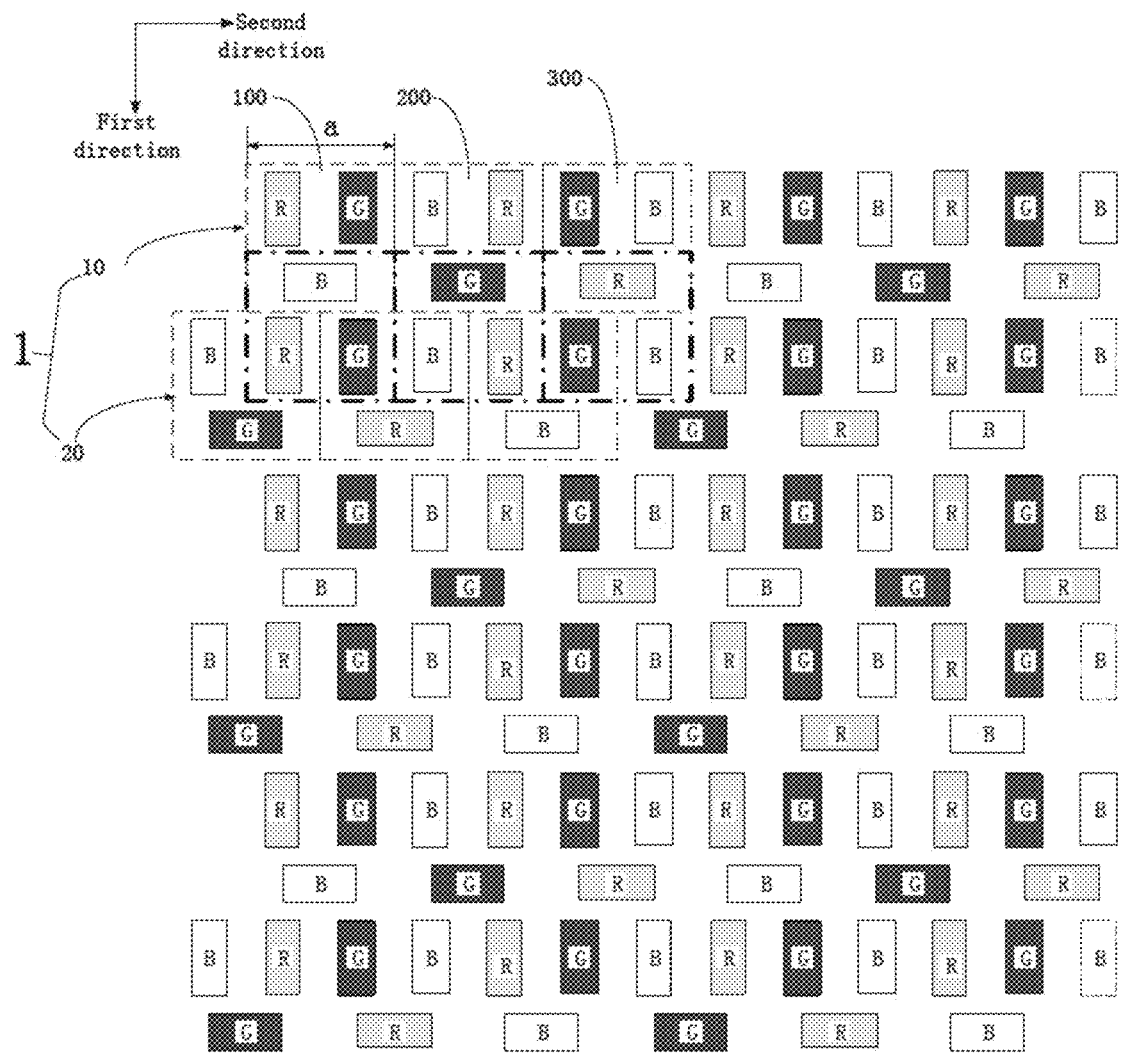
FIG. 8 is a schematic diagram illustrating the structure of a subpixel arrangement structure in a display panel in some embodiments according to the present disclosure.

FIG. 7 is a schematic diagram illustrating the structure a subpixel repeating unit in a display panel in a subpixel arrangement structure in some embodiments according to the present disclosure. FIG. 8 is a schematic diagram illustrating the structure of a subpixel arrangement structure in a display panel in some embodiments according to the present disclosure. Referring to FIG. 7 and FIG. 8, each of the plurality of repeating units 1 includes one of the plurality of first subpixel groups 10 and one of the plurality of second subpixel groups 20. The plurality of first subpixel groups 10 are repeated in a first row R1 substantially along the second direction. The plurality of second subpixel groups 20 are repeated in a second row R2 substantially along the second direction, the second row R2 adjacent to the first row R1.

Each of the plurality of first subpixel groups 10 includes three pixels 100, 200, and 300 each of the three pixels includes three subpixels of different colors (e.g., red, green, and blue). Each of the plurality of second subpixel groups 20 includes three pixels 400, 500, and 600, each of the three pixels includes three subpixels of different colors (e.g., red, green, and blue). Light from the three subpixels of different colors in each of the three pixels is configured to produce white light when mixed in a certain ratio.

Referring to FIG. 7, the three subpixels of different colors in each pixel (e.g., pixel 100, 200, 300, 400, 500, or 600) are arranged in two separate sub-rows, e.g., a first sub-row sr1 and a second sub-row sr2. Each pixel includes two subpixels in the first sub-row sr1 and one subpixel in the second sub-row sr2, Subpixels in the second sub-row sr2 of the three pixels in each of the plurality of first subpixel groups 10 or in each of the plurality of second subpixel groups 20 are subpixels of different colors. For example, the pixel 100 in one of the plurality of first subpixel groups 10 includes a red subpixel R and a green subpixel G in the first sub-row sr1 and a blue subpixel B in the second sub-row sr2. The pixel 200 in one of the plurality of first subpixel groups 10 includes a blue subpixel B and a red subpixel R in the first sub-row sr1, and a green subpixel G in the second sub-row sr2. The pixel 300 in one of the plurality of first subpixel groups 10 includes a green subpixel G and a blue subpixel B in the first sub-row sr1, and a red subpixel R in the second sub-row sr2. The pixel 400 in one of the plurality of second subpixel groups 20 includes a blue subpixel B and a red subpixel R the first sub-row sr1, and a green subpixel G in the second sub-row sr2. The pixel 500 in one of the plurality of second subpixel groups 20 includes a green subpixel G and a blue subpixel B in the first sub-row sr1, and a red subpixel R in the second sub-row sr2. The pixel 600 in one of the plurality of second subpixel groups 20 includes a red subpixel R and a green subpixel G in the first sub-row sr1, and a blue subpixel B in the second sub-row sr2. Subpixels in the second sub-row sr1 of the three pixels 100, 200, 300) in the one of the plurality of first subpixel groups 10 are subpixels of different colors, e.g., a blue subpixel B, a green subpixel G, and a red subpixel R. Subpixels in the second sub-row sr1 the three pixels 400, 500, 600 in the one of the plurality of second subpixel groups 20 are subpixels of different colors, e.g., a green subpixel G, a red subpixel R, and a blue subpixel B.

The one of the plurality of first subpixel groups 10 and the one of the plurality of second subpixel groups 20 in each of the plurality of subpixel repeating units 1 are staggered relative to each other. The second sub-row sr2 in the one of the plurality of first subpixel groups 10 is adjacent to the first sub-row sr1 of the one of the plurality of second subpixel groups 20. The second sub-row sr2 in the one of the plurality of second subpixel groups 20 is adjacent to the first sub-row sr1 of the one of the plurality of first subpixel groups 10. Each subpixel in the second sub row sr2 in the one of the plurality of first subpixel groups 10 and two adjacent subpixels in the first sub-row sr1 in the one of the plurality of second subpixel groups 20 are subpixels of three different colors. For example, the blue subpixel B in the second sub-row sr2 in the pixel 100 and two adjacent subpixels, the red subpixel R in the first sub-row r1 in pixel 400 and the green subpixel G in the first sub-row r1 in pixel 500, are subpixels of three different colors, blue, red, and green. The green subpixel G in the second sub-row sr2 in the pixel 200 and two adjacent subpixels, the blue subpixel B in the first sub-row r1 in pixel 500 and the red subpixel R in the first sub-row r1 in pixel 600, are subpixels of three different colors, green, blue, and red. The red subpixel R in the second sub-row sr2 in the pixel 300 and two adjacent subpixels, the green subpixel G in the first sub-row r1 pixel 600 and the blue subpixel B in the first sub-row r1 in pixel 400, are subpixels of three different colors, green, blue, and red. Similarly, each subpixel in the second sub-row sr2 the one of the plurality of second subpixel groups 20 and two adjacent subpixels in the first sub-row sr1 in the one of the plurality of first subpixel groups 10 are subpixels of three different colors.

In the present subpixel arrangement structure, the six pixels (100, 200, 300, 400, 500, and 600) are arranged in two rows (R1 and R2). In each row (R1 or R2), the three pixels have different arrangements of subpixels of different colors. For example, pixels 100, 200, and 300 in the first row R1 have different arrangements of the red subpixel R, the blue subpixel B and the green subpixel G. Pixels 400, 500, and 600 in the second row R2 have different arrangements of the red subpixel R, the blue subpixel B, and the green subpixel G. Each subpixel in the second sub-row sr2 in the one of the plurality of first subpixel groups 10 and two adjacent subpixels in the first sub-row sr1 in the one of the plurality of second subpixel groups 20 are subpixels of three different colors. Thus, one subpixel in the second, sub-row sr2 in the one of the plurality of first subpixel groups 10 and two adjacent subpixels in the first sub-row sr1 in the one of the plurality of second subpixel groups 20 constitute a pixel (see, e.g., three pixels denoted as three solid-line boxes in FIG. 7). Accordingly, each of the plurality of subpixel repeating units 1 not only includes one of the plurality of first subpixel groups 10 and one of the plurality of second subpixel groups 20, but also includes an additional subpixel group 30 having three Pentile type pixels (e.g., the three pixels denoted as three solid-line boxes in FIG. 7). Thus, each of the plurality of subpixel repeating units 1 includes two subpixel groups (e.g., 10 and 20) each having three RGB type pixels and one subpixel group 30 having three Pentile type pixels.

Thus, in the present subpixel arrangement structure, three rows of virtual pixels may be derived from two rows of real pixels, five rows of virtual pixels may be derived from three rows of real pixels, and (2n-1) rows of virtual pixels may be derived from n rows of real pixels, greatly enhancing the resolution of a display panel having the present subpixel arrangement structure. When displaying a 45-degree diagonal white line, the contents are displayed more continuously and smoothly as compared to the conventional display panels, significantly improving the issues of granularity and jagged edges in the displayed image. Moreover, the present subpixel arrangement structure is compatible for use in both low-PPI and high-PPI display panels. As compared to the conventional Pentile type display panel, the display panel having the present subpixel arrangement structure has many advantages.

The subpixels in the present subpixel arrangement structure may have various appropriate shapes, dimensions, and sizes. Examples of appropriate shapes include a rectangular shape, a square shape, a circular shape, a diamond shape, a pentagonal shape, a hexagonal shape, and so on. Optionally, all subpixels in the first sub-row sr1 are of a substantially the same shape, dimension, and size. Optionally, all subpixels in the second sub-row sr2 are of a substantially the same shape, dimension, and size. Optionally, all subpixels in the present subpixel arrangement structure are of a substantially the same shape, dimension, and size.

In some embodiments, each subpixel in each of the plurality of first subpixel groups 10 and each of the plurality of second subpixel groups 20 has a rectangular shape. Optionally, a longitudinal direction of each subpixel in each first sub-row sr1 of the plurality of first subpixel groups 10 and the plurality of second subpixel groups 20 is substantially parallel to the first direction, e.g., a column direction. For example the longitudinal direction of each subpixel in each first sub-row sr1 of pixels 100, 200, 300, 400, 500, and 600 is substantially parallel to the first direction. Optionally, a longitudinal direction of each subpixel in each second sub-row sr2 of the plurality of first subpixel groups 10 and the plurality of second subpixel groups 20 is substantially parallel to the second direction, e.g., the row direction. For example, the longitudinal direction of each subpixel in each second sub-row sr2 of pixels 100, 200, 300, 400, 500, and 600 is substantially parallel to the first direction. As used herein, the term "longitudinal direction" refers to a direction parallel to a long side (e.g., the longest side) of an object or a surface. As used herein, the term "lateral direction" refers to a direction parallel to a short side (e.g., the shortest side) of an object or a surface.

Referring to FIG. 7, each of the three pixels of each of the plurality of first subpixel groups 10 has a pixel width a, and each of the three pixels of each of the plurality of second subpixel groups 20 also has a pixel width a. Optionally, the one of the plurality of first subpixel groups 10 and the one of the plurality of second subpixel groups 20 in each of the plurality of subpixel repeating units 1 are staggered relative to each other by a distance in a range of approximately 0.4a to approximately 0.4a, e.g., by a distance of approximately 0.5a. By having this design, one subpixel in the second sub-row sr2 in any pixel of the one of the plurality of first subpixel groups 10 and two adjacent subpixels in the first sub-row sr1 in the one of the plurality of second subpixel groups 20 constitute a pixel. Referring to FIG. 7 and FIG. 8, the blue subpixel B in the second sub-row sr2 in the pixel 100 in the one of the plurality of first subpixel groups 10, and two adjacent subpixels, the red subpixel R in the first sub-row r1 in pixel 400 and the green subpixel G in the first sub-row r1 in pixel 500, in the one of the plurality of second subpixel groups 20, constitute a pixel (see, e.g., the pixels denoted as three solid-line boxes in FIG. 7).

When displaying a 45-degree diagonal white line using a display panel having the present subpixel arrangement structure in which each pixel has a pixel area of approximately $a^2$ (a is the pixel width), the contents are displayed more continuously and smoothly as compared to the conventional Pentile type display panel in which each pixel has a same pixel area, significantly improving the issues of granularity and jagged edges in the displayed image. For example, and as shown in FIG. 2, the conventional Pentile type subpixel arrangement structure has a minimum constituent pixel unit along the diagonal white line having an area of (a*(a+W)), W is a subpixel width of a subpixel R, a subpixel B, or a subpixel G. In the 45-degree diagonal white line displayed in the conventional Pentile type subpixel arrangement structure, two adjacent minimum constituent pixel units along the 45-degree diagonal white line are shifted relative to each other along the horizontal direction by a distance a.

Figure 9:
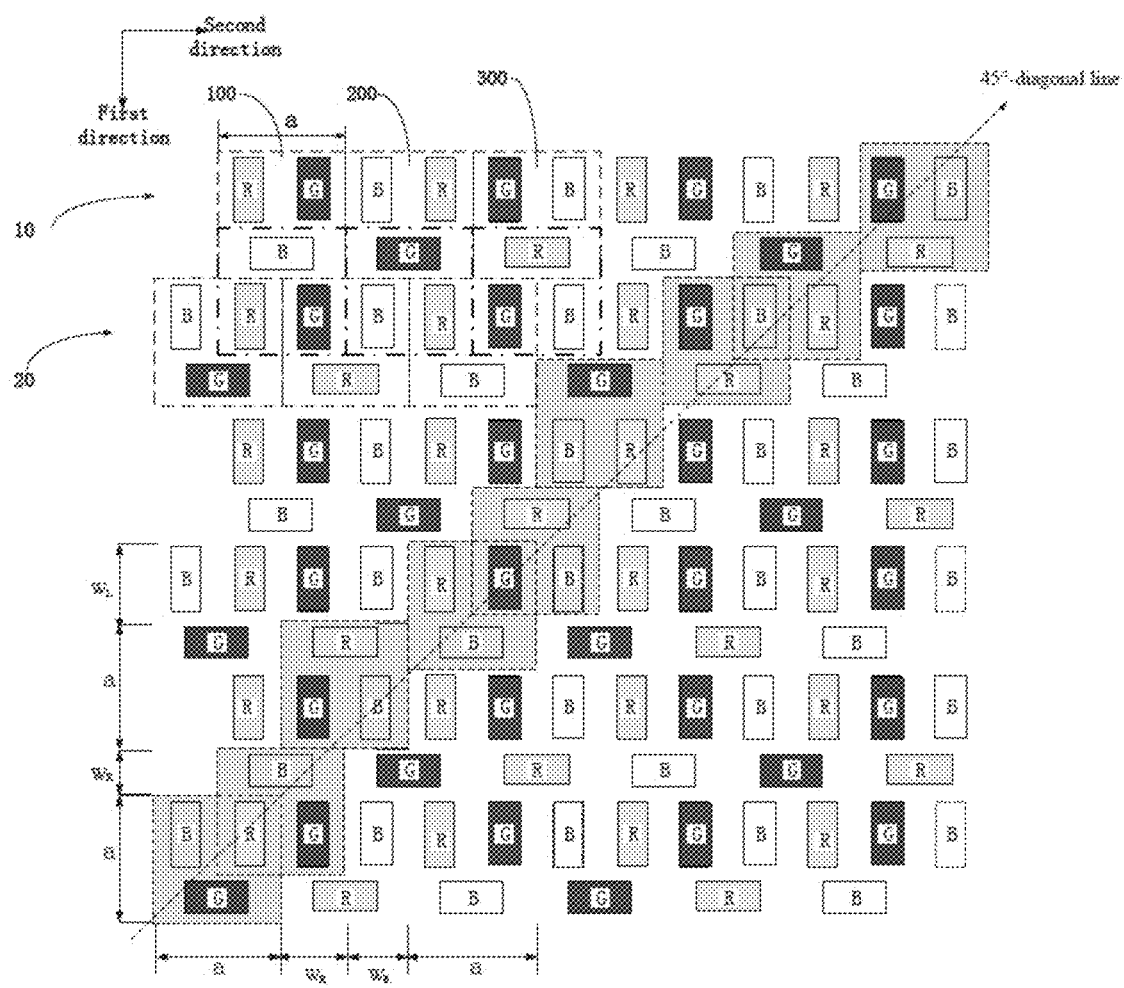
FIG. 9 is a schematic diagram illustrating the display of a 45-degree diagonal white line in a subpixel arrangement structure in a display panel in some embodiments according to the present disclosure.

FIG. 9 is a schematic diagram illustrating the display of a 45-degree diagonal white line in a subpixel arrangement structure in a display panel in some embodiments according to the present disclosure. Referring to FIG. 9, the present subpixel arrangement structure has a minimum constituent pixel unit along the diagonal white line having an area of $a^2$. In the 45-degree diagonal white line displayed in the present subpixel arrangement structure, two adjacent minimum constituent pixel units along the 45-degree diagonal white line are shifted relative to each other along the horizontal direction by a distance a. In the 45-degree diagonal white line displayed in the present subpixel arrangement structure, two adjacent minimum constituent pixel units along the 45-degree diagonal white line are shifted relative to each other along the horizontal direction (the second direction) by a distance of $W_L$ (a longitudinal width of a subpixel) $W_R$ (a lateral width of a subpixel), or a pixel width a; and two adjacent minimum constituent pixel units along the 45-degree diagonal white line are shifted relative to each other along the vertical direction (the first direction) by a distance of $W_L$ (a longitudinal width of a subpixel), $W_R$ (a lateral width of a subpixel), or a pixel width a. As compared to the conventional Pentile type subpixel arrangement structure, the relative shift of the adjacent minimum constituent pixel units along the first direction and the second direction is reduced in the present subpixel arrangement structure, the contents are displayed more continuously and smoothly, significantly improving the issues of granularity and jagged edges in the displayed image. Moreover, the present subpixel arrangement structure is compatible for use in both low-PPI and high-PPI display panels. As compared to the conventional Pentile type display panel, the display panel having the present subpixel arrangement structure has many advantages.

In some embodiments, in each pixel, the two subpixels in the first sub-row sr1 are spaced apart from each other, and they one subpixel in the second sub-row sr2 is disposed at a position corresponding to the space between the two subpixels the first sub-row sr1, as shown in FIG. 9. Optionally, in each of the three pixels of each of the plurality of first subpixel groups 10, a longitudinal side of the one subpixel the second sub-row sr2 adjacent to lateral sides of the two subpixels in the first sub-row sr1; and in each of the plurality of second subpixel groups 20, a longitudinal side of the one subpixel in the second sub-row sr2 is adjacent to lateral sides of the two subpixels in the first sub-row sr1. For example, referring to FIG. 6, the longitudinal side of the subpixel 11-C1-1 is adjacent to the lateral sides of the subpixels 12-C3-2 and 12-C2-2. In another example, referring to FIG. 7, the longitudinal side of the green subpixel G in the second sub-row sr2 in the pixel 400 is adjacent to the lateral sides of the blue subpixel B and the red subpixel R in the first sub-row sr1 in the pixel 400. Similarly, the longitudinal side of the one subpixel in the second sub-row sr2 in each of the three pixels of each of the plurality of first subpixel groups 10 is adjacent to the lateral sides of the two adjacent subpixels in the first sub-row sr1 from one or more of the plurality of second subpixel groups 20. Optionally, the longitudinal side of the one subpixel in the second sub-row sr2 in each of the three pixels of each of the plurality of second subpixel groups 20 is adjacent to the lateral sides of the two adjacent subpixels in the first sub-row sr1 from one or more of the plurality of first subpixel groups 10.

In some embodiments, two adjacent subpixels respectively in two adjacent pixels in the first sub-row sr1 are spaced apart by a first distance; and two adjacent subpixels respectively in two adjacent pixels in the second sub-row sr2 are spaced apart by a second distance. Optionally, the first distance is substantially the same as the second distance.

In some embodiments, the one of the plurality of first subpixel groups 10 in each of the plurality of subpixel repeating units 1 includes a first pixel 100, a second pixel 200, and a third pixel 300 along the second direction; the one of the plurality of second subpixel groups 20 in each of the plurality of subpixel repeating units 1 includes a fourth pixel 400, a fifth pixel 500, and a sixth pixel 600 along the second direction. Optionally, each of the first pixel 100, the second pixel 200, the third pixel 300, the fourth pixel 400, the fifth pixel 500, and the sixth pixel 600 includes a subpixel of the first color, a subpixel of the second color, and a subpixel of the third color. Optionally, the first pixel 100 includes the subpixel of the third color and the subpixel of the second color sequentially along the second direction in the first sub-row sr1, and the subpixel of the first color in the second sub-row sr2. Optionally, the second pixel 200 includes the subpixel of the first color and the subpixel of the third color sequentially along the second direction in the first sub-row sr1, and the subpixel of the second color in the second sub-row sr2. Optionally, the third pixel 300 includes the subpixel of the second color and the subpixel of the first color sequentially along the second direction in the first sub-row sr1, and the subpixel of the third color in the second sub-row sr2. Optionally, the fourth pixel 400 includes the subpixel of the first color and the subpixel of the third color sequentially along the second direction in the first sub-row sr1, and the subpixel of the second color in the second sub-row sr2. Optionally, the fifth pixel 500 includes the subpixel of the second color and the subpixel of the first color sequentially along the second direction in the first sub-row sr1, and the subpixel the third color in the second sub-row sr2. Optionally, the sixth pixel 600 includes the subpixel of the third color and the subpixel of the second color sequentially along the second direction in the first sub-row sr1, and the subpixel of the first color in the second sub-row sr2. Thus, the first pixel 100 and the sixth pixel 600 have a same subpixel arrangement structure, the second pixel 200 and the fourth pixel 400 have a same subpixel arrangement structure, and the third pixel 300 and the fifth pixel 500 have a same subpixel arrangement structure.

In some embodiments, the first color, the second color, and the third color are three different colors selected from blue, green, and red. Optionally, the first color is blue, the second color is green, and the third color is red. Optionally, the first pixel 100 and the sixth pixel 600 are RGB pixels, the second pixel 200 and the fourth pixel 400 are BRG pixels, and the third pixel 300 and the fifth pixel 500 are GBR pixels.

In one example, each of the plurality of subpixel repeating units 1 includes six pixels, namely the first pixel 100, the second pixel 200, the third pixel 300 in the first row R1; and the fourth pixel 400, the fifth pixel 500, the sixth pixel 600 in the second row R2. In another example, each of the plurality of first subpixel groups 10 in the first row R1 includes a RGB pixel, a BRG pixel, a GBP pixel, and each of the plurality of second subpixel groups 20 in the second row R2 includes a BRG pixel, a GBR and a RGB pixel. The one of the plurality of first subpixel groups 10 and the one of the plurality of second subpixel groups 20 in each of the plurality of subpixel repeating units 1 are staggered relative to each other by a distance of approximately 0.5a, wherein a is the pixel width. By having this subpixel arrangement structure, the blue subpixel B in the first pixel 100 (a RGB pixel) in the one of the plurality of first subpixel groups 10, the red subpixel R in the fourth pixel 400 (a BRG pixel) in the one of the plurality of second subpixel groups 20, and the green subpixel G in the fifth pixel 500 (a GBR pixel) in the one of the plurality of second subpixel groups 20, constitute a virtual pixel RGB'. Similarly, the green subpixel G in the second pixel 200 (a BRG pixel) in the one of the plurality of first subpixel groups 10, the blue subpixel B in the fifth pixel 500 (a GBR pixel) in the one of the plurality of second subpixel groups 20, and the red subpixel R in the sixth pixel 600 (a RGB pixel) in the one of the plurality of second subpixel groups 20, constitute a virtual pixel BRG'. The red subpixel R in the third pixel 300 (a GBR pixel) in the one of the plurality of first subpixel groups 10, the green subpixel G in the sixth pixel 600 (a RGB pixel) in the one of the plurality of second subpixel groups 20, and the blue subpixel B in the fourth pixel 400 (a BRG pixel) in the one of the plurality of second subpixel groups 20, constitute a virtual pixel GBR'. The virtual pixel RGB' and the first pixel 100 have a mirror symmetry with respect to each other. The virtual pixel BRG' and the second pixel 200 have a mirror symmetry with respect to each other. The virtual pixel GBR' and the third pixel 300 have a mirror symmetry with respect to each other.

Optionally, the first color, the second color, and the third color are three different colors selected from yellow, magenta, and cyan.

Optionally, the subpixel of the first color, the subpixel of the second color, and the subpixel of the third color have a substantially the same shape, size, and dimension. By having this design, patterning of a layer (e.g., vapor deposition) in subpixels of a first color may be performed using a mask plate having a plurality of light transmissive regions corresponding to the subpixels of the first color. Subsequently, patterning of a corresponding layer in subpixels of a second color may be performed using the same mask plate simply by moving the plurality of light transmissive regions to positions corresponding to the subpixels of the second color. Similarly, patterning of a corresponding layer in subpixels of a third color may be performed using the same mask plate simply by moving the plurality of light transmissive regions to positions corresponding to the subpixels of the third color.

In another aspect, the present disclosure provides a display apparatus having the subpixel arrangement structure described herein. Optionally, each of the first subpixel of the first color, the first subpixel of the second color, the first subpixel of the third color, the second subpixel of the first color, the second subpixel of the second color, the second subpixel of the third color, the third subpixel of the first color, the third subpixel of the second color, and the third subpixel of the third color is electrically connected to a different driving thin film transistor. Optionally, the display apparatus further includes a control circuit operatively connected to the subpixels in the display apparatus, and configured to receive display data and convert the display data into control signal for driving the subpixels in the subpixel arrangement structure. Examples of appropriate display apparatuses includes, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

Figure 10:
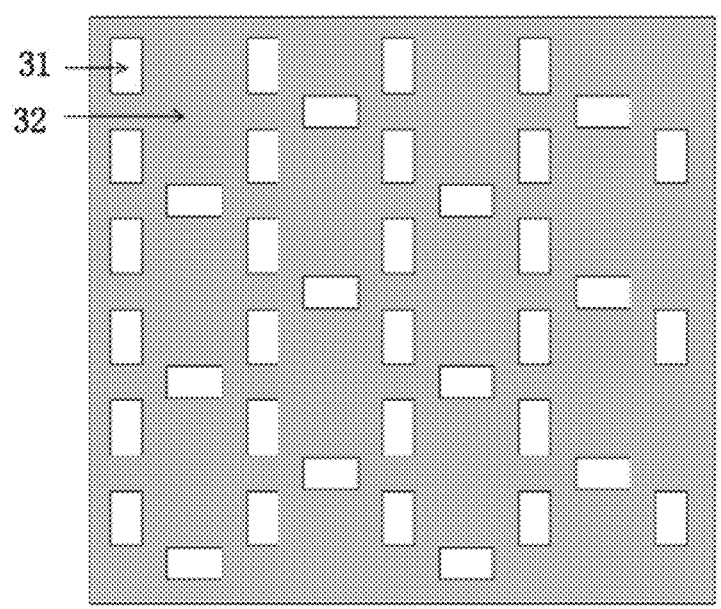
FIG. 10 is a schematic diagram illustrating the structure of a mask plate for fabricating a subpixel arrangement structure in a display panel in some embodiments according to the present disclosure.

In another aspect, the present disclosure further provides a mask plate for fabricating the subpixel arrangement structure described herein. FIG. 10 is a schematic diagram illustrating the structure of a mask plate for fabricating a subpixel arrangement structure in a display panel in some embodiments according to the present disclosure. Referring to FIG. 10, the mask plate includes a plurality of light transmissive regions 31 and a light blocking region 32. Each of the plurality of light transmissive regions 31 corresponds to a subpixel of a same color.

In some embodiments, the subpixel of the first color, the subpixel of the second color, and the subpixel of the third color have a substantially the same shape, size, and dimension. By having this design, patterning of a layer (e.g., by vapor deposition) in subpixels of a first color may be performed using a mask plate having a plurality of light transmissive regions corresponding to the subpixels of the first color. Subsequently, patterning of a corresponding layer in subpixels of a second color may be performed using the same mask plate simply by moving the plurality of light transmissive regions to positions corresponding to the subpixels of the second color. Similarly, patterning of a corresponding layer in subpixels of a third color may be performed using the same mask plate simply by moving the plurality of light transmissive regions to positions corresponding to the subpixels of the third color. Thus, a same mask plate may be used for patterning of the subpixels of the first color, the second color, and the third color, in three patterning steps respectively.

In some embodiments, the subpixel of the first color, the subpixel of the second color, and the subpixel of the third color have different shapes, sizes, and dimensions. Optionally, three different mask plates are needed for patterning the subpixels of the first color, the second color, and the third color.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having a display area tessellated by repetition of a first subpixel group, comprising an array of a plurality of first subpixel groups;

wherein each of the plurality of first subpixel groups comprises a first subgroup and a second subgroup sequentially along a first direction;

the first subgroup comprising a first subpixel of a first color, a first subpixel of a second color, and a first subpixel of a third color, sequentially along a second direction, the second direction being different from the first direction;

the second subgroup comprising a second subpixel of the third color, a second subpixel of the second color, a second subpixel of the first color, a third subpixel of the third color, a third subpixel of the second color, and a third subpixel of the first color, sequentially along the second direction;

the first subpixel of the first color in the first subgroup is adjacent to the second subpixel of the third color and the second subpixel of the second color in the second subgroup;

the first subpixel of the second color in the first subgroup is adjacent to the second subpixel of the first color and the third subpixel of the third color in the second subgroup;

and the first subpixel of the third color in the first subgroup is adjacent to the third subpixel of the second color and the third subpixel of the first color in the second subgroup; wherein the plurality of first subpixel groups in each row along the second direction are repeated; and the plurality of first subpixel groups in each row are staggered relative to the plurality of first subpixel groups in an adjacent row.

2. The display panel of claim 1, wherein the display area is tessellated by repetition of a subpixel repeating unit, the display panel comprises an array of a plurality of subpixel repeating units;

the plurality of subpixel repeating units comprises the plurality of first subpixel groups and a plurality of second subpixel groups;

each of the plurality of subpixel repeating units comprises one of the plurality of first subpixel groups and one of the plurality of second subpixel groups sequentially along the first direction;

wherein each of the plurality of second subpixel groups comprises a third subgroup and a fourth subgroup sequentially along a first direction;

the third subgroup comprising a fourth subpixel of the second color, a fourth subpixel of the third color, and a fourth subpixel of the first color, substantially along the second direction;

the fourth subgroup comprising a fifth subpixel of the first color, a fifth subpixel of the third color, a fifth subpixel of the second color, a sixth subpixel of the first color, a sixth subpixel of the third color, and a sixth subpixel of the second color, substantially along the second direction;

the fourth subpixel of the second color in the third subgroup is adjacent to the fifth subpixel of the first color and the fifth subpixel of the third color in the fourth subgroup;

the fourth subpixel of the third color in the third subgroup is adjacent to the fifth subpixel of the second color and the sixth subpixel of the first color in the fourth subgroup; and the first subpixel of the first color in the third subgroup is adjacent to the sixth subpixel of the third color and the sixth subpixel of the second color in the fourth subgroup.

3. The display panel of claim 2, wherein the plurality of subpixel repeating units in each row along the second direction are repeated; and the plurality of subpixel repeating units in each column along the first direction are repeated.

4. The display panel of claim 2, wherein the first subpixel of the first color in the first subgroup is adjacent to the fifth subpixel of the third color and the fifth subpixel of the second color in the fourth subgroup;

the first subpixel of the second color in the first subgroup is adjacent to the sixth subpixel of the first color and the sixth subpixel of the third color in the fourth subgroup; and the first subpixel of the third color in the first subgroup is adjacent to the sixth subpixel of the second color and the fifth subpixel of the first color in the fourth subgroup.

5. The display panel of claim 2, wherein the fourth subpixel of the second color in the third subgroup is adjacent to the third subpixel of the first color in the second subgroup in one of the plurality of first subpixel groups in a first adjacent subpixel repeating unit, and the second subpixel of the third color in one of the plurality of first subpixel groups in a second adjacent subpixel repeating unit;

the fourth subpixel of the third color in the third subgroup is adjacent to the second subpixel of the second color and the second subpixel of the first color in the second subgroup in one of the plurality of first subpixel groups in the next adjacent subpixel repeating unit; and the fourth subpixel of the first color in the third subgroup is adjacent to the third subpixel of the third color and the third subpixel of the second color in the second subgroup in one of the plurality of first subpixel groups in the next adjacent subpixel repeating unit.

6. The display panel of claim 2, wherein the plurality of first subpixel groups are repeated in a first row substantially along the second direction;

the plurality of second subpixel groups are repeated in a second row substantially along the second direction, the second row adjacent to the first row;

each of the plurality of first subpixel groups and each of the plurality of second subpixel groups comprises three pixels, each of which comprises three subpixels of different colors;

the three subpixels of different colors in each of the three pixels are arranged in a first sub-row and a second sub-row;

each of the three subpixels of different colors comprises two subpixels in the first sub-row and one subpixel in the second sub-row;

subpixels in the second sub-row of the three pixels are subpixels of different colors;

the one of the plurality of first subpixel groups and the one of the plurality of second subpixel groups in each of the plurality of subpixel repeating units are staggered relative to each other, the second sub-row in the one of the plurality of first subpixel groups is adjacent to the first sub-row of the one of the plurality of second subpixel groups;

each subpixel in the second sub-row in the one of the plurality of first subpixel groups and two adjacent subpixels in the first sub-row in the one of the plurality of second subpixel groups are subpixels of three different colors.

7. The display panel of claim 6, wherein light from the three subpixels of different colors in each of the three pixels is configured to produce white light when mixed in a certain ratio.

8. The display panel of claim 6, wherein each subpixel in each of the plurality of first subpixel groups and each of the plurality of second subpixel groups has a rectangular shape.

9. The display panel of claim 8, wherein a longitudinal direction of each subpixel in each first sub-row of the plurality of first subpixel groups and the plurality of second subpixel groups is substantially parallel to the first direction; and a longitudinal direction of each subpixel in each second sub-row of the plurality of first subpixel groups and the plurality of second subpixel groups is substantially parallel to the second direction.

10. The display panel of claim 8, wherein, in each of the three pixels of each of the plurality of first subpixel groups and each of the plurality of second subpixel groups, a longitudinal side of the one subpixel in the second sub-row is adjacent to lateral sides of the two subpixels in the first sub-row.

11. The display panel of claim 6, wherein each of the three pixels of each of the plurality of first subpixel groups and each of the plurality of second subpixel groups has a pixel width; and the one of the plurality of first subpixel groups and the one of the plurality of second subpixel groups in each of the plurality of subpixel repeating units are staggered relative to each other by a distance in a range of approximately 0.4 of the pixel width to approximately 0.6 of the pixel width.

12. The display panel of claim 11, wherein two adjacent subpixels respectively in two adjacent pixels in the first sub-row are spaced apart by a first distance;

two adjacent subpixels respectively in two adjacent pixels in the second sub-row are spaced apart by a second distance; and the first distance is substantially the same as the second distance.

13. The display panel of claim 6, wherein the one of the plurality of first subpixel groups in each of the plurality of subpixel repeating units comprises a first pixel, a second pixel, and a third pixel along the second direction;

the one of the plurality of second subpixel groups in each of the plurality of subpixel repeating units comprises a fourth pixel, a fifth pixel, and a sixth pixel along the second direction;

each of the first pixel, the second pixel, the third pixel, the fourth pixel, the fifth pixel, and the sixth pixel comprises a subpixel of the first color, a subpixel of the second color, and a subpixel of the third color;

the first pixel comprising the subpixel of the third color and the subpixel of the second color sequentially along the second direction in the first sub-row, and the subpixel of the first color in the second sub-row;

the second pixel comprising the subpixel of the first color and the subpixel of the third color sequentially along the second direction in the first sub-row, and the subpixel of the second color in the second sub-row;

the third pixel comprising the subpixel of the second color and the subpixel of the first color sequentially along the second direction in the first sub-row, and the subpixel of the third color in the second sub-row;

the fourth pixel comprising the subpixel of the first color and the subpixel of the third color sequentially along the second direction in the first sub-row, and the subpixel of the second color in the second sub-row;

the fifth pixel comprising the subpixel of the second color and the subpixel of the first color sequentially along the second direction in the first sub-row, and the subpixel of the third color in the second sub-row;

the sixth pixel comprising the subpixel of the third color and the subpixel of the second color sequentially along the second direction in the first sub-row, and the subpixel of the first color in the second sub-row.

14. The display panel of claim 1, wherein the first color, the second color, and the third color are three different colors selected from blue, green, and red.

15. The display panel of claim 1, wherein the first color, the second color, and the third color are three different colors selected from yellow, magenta, and cyan.

16. A display apparatus, comprising the display panel of claim 1.

17. The display apparatus of claim 16, wherein each of the first subpixel of the first color, the first subpixel of the second color, the first subpixel of the third color, the second subpixel of the first color, the second subpixel of the second color, the second subpixel of the third color, the third subpixel of the first color, the third subpixel of the second color, and the third subpixel of the third color is electrically connected to a different driving thin film transistor.

18. The display apparatus of claim 16, wherein the display apparatus is an organic light emitting diode display apparatus.

19. A mask plate for fabricating the display panel of claim 1;

wherein the mask plate has a plurality of light transmissive regions, each of which corresponding to a subpixel of a same color.

* * * * *